United States Patent
Roh et al.

(10) Patent No.: US 8,966,346 B2
(45) Date of Patent: *Feb. 24, 2015

(54) APPARATUS AND METHOD FOR PROCESSING A PHYSICAL LAYER CONVERGENCE PROTOCOL HEADER

(71) Applicant: Texas Instruments Incorporated, Dallas, TX (US)

(72) Inventors: June Chul Roh, Allen, TX (US); Anuj Batra, Dallas, TX (US); Srinath Hosur, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/073,128

(22) Filed: Nov. 6, 2013

(65) Prior Publication Data

US 2014/0064262 A1 Mar. 6, 2014

Related U.S. Application Data (63) Continuation of application No. 13/220,310, filed on Aug. 29, 2011, now Pat. No. 8,601,349.

(60) Provisional application No. 61/377,741, filed on Aug. 27, 2010.

(51) Int. Cl.
| | |
|---|---|
| *H03M 13/00* | (2006.01) |
| *H04L 29/06* | (2006.01) |
| *H03M 13/15* | (2006.01) |
| *H04L 1/00* | (2006.01) |
| *H04L 12/26* | (2006.01) |
| *H04L 1/18* | (2006.01) |

(52) U.S. Cl.
CPC ............. *H04L 69/22* (2013.01); *H03M 13/152* (2013.01); *H03M 13/155* (2013.01); *H04L 1/0079* (2013.01); *H04L 43/0823* (2013.01); *H04L 1/0057* (2013.01); *H04L 1/1812* (2013.01)
USPC ......................................................... 714/774

(58) Field of Classification Search
CPC .......... H03M 13/1545; H03M 13/152; H03M 13/155; H03M 13/1102; H04L 1/0079; H04L 27/20
USPC .......... 714/746, 774, 800, 776, 782, 784–786
See application file for complete search history.

(56) References Cited

U.S. PATENT DOCUMENTS

| | | | | |
|---|---|---|---|---|
| 7,606,222 | B2 * | 10/2009 | Bronner et al. ................ | 370/352 |
| 2010/0226315 | A1 * | 9/2010 | Das et al. ....................... | 370/328 |
| 2011/0179335 | A1 * | 7/2011 | Hong et al. .................... | 714/755 |

* cited by examiner

*Primary Examiner* — Shelly A Chase
(74) *Attorney, Agent, or Firm* — Steven A. Shaw; Frederick J. Telecky, Jr.

(57) ABSTRACT

Apparatus and method for processing a physical layer protocol convergence (PLCP) header. In one embodiment, a wireless device includes a PLCP header processor. The PLCP header processor is configured to: process a physical layer header, process a check value based on the physical layer header, and process an error correction code based on the physical layer header and the check value. A concatenation of the physical layer header, check value, and error correction code the PLCP header processor is configured to process consists of a number of information bits that is an integer multiple of a number of information bits per symbol used to encode the PLCP header.

15 Claims, 5 Drawing Sheets

APPARATUS AND METHOD FOR PROCESSING A PHYSICAL LAYER CONVERGENCE PROTOCOL HEADER

CROSS-REFERENCE TO RELATED APPLICATIONS

This application is a Continuation of U.S. patent application Ser. No. 13/220,310, filed Aug. 29, 2011, which claims priority to U.S. Provisional Patent Application No. 61/377,741, filed on Aug. 27, 2010; which is hereby incorporated herein by reference in its entirety.

BACKGROUND

Body area networks (BANs) are a low-power short-range wireless technology that can be used for medical applications, such as digital band-aids and pacemakers, and for entertainment and consumer electronics applications, including heads-up displays and wireless gaming. Body area networks are being designed for use in several radio frequency bands, including 400 MHz Medical Implant Communications Service ("MICS") band, 900 MHz and 2.4 GHz Industrial, Scientific and Medical ("ISM") band, and 3.1-10.6 GHz Ultra Wideband (UWB).

Standards are being promulgated to facilitate development and adoption of BANs and similar personal area networks. IEEE 802.15.6 is one such standard. IEEE 802.15.6 specifies the medium access control and physical layer requirements for compliant wireless networks.

SUMMARY

An apparatus and method for processing a physical layer convergence protocol (PLCP) header in a wireless device are disclosed herein. In one embodiment, a wireless device includes a PLCP header processor. The PLCP header processor is configured to: process a physical layer header, process a check value based on the physical layer header, and process an error correction code based on the physical layer header and the check value. A concatenation of the physical layer header, the check value, and the error correction code that the PLCP header processor is configured to process consists of a number of information bits that is an integer multiple of a number of information bits per symbol used to encode the PLCP header.

In another embodiment, a method includes generating a physical layer header. A check value based on the physical layer header is generated. An error correction code based on the physical layer header and the check value is generated. The physical layer header, check value, and error correction code are encoded into symbols. The sum of information bits in the physical layer header, check value, and error correction code is an integer multiple of the number of information bits encoded per symbol.

In a further embodiment, a system includes a wireless transmitter and a wireless receiver. The wireless transmitter is configured to transmit information via a wireless network. The wireless receiver is configured to receive the information via the wireless network. Each of the transmitter and receiver comprises logic configured to process a PLCP header including a physical layer header, a check value based on the physical layer header, and an error correction code based on the physical layer header and the check value. The aggregate number of information bits of the physical layer header, check value, and error correction code is an integer multiple of a number of information bits per symbol of the PLCP header.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. Further, the term "software" includes any executable code capable of running on a processor, regardless of the media used to store the software. Thus, code stored in memory (e.g., non-volatile memory), and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Wireless networking systems endeavor to optimize use of wireless resources, such as time spent accessing the wireless medium. However, in some systems the effectiveness of efforts to optimize network transactions may be hampered by inefficiency in the arrangement of the data elements that are transferred via the wireless network. Embodiments of the present disclosure generate physical layer convergence protocol (PLCP) headers that improve network efficiency by aligning the headers with the symbol blocks used to encode data packets.

Figure 1:
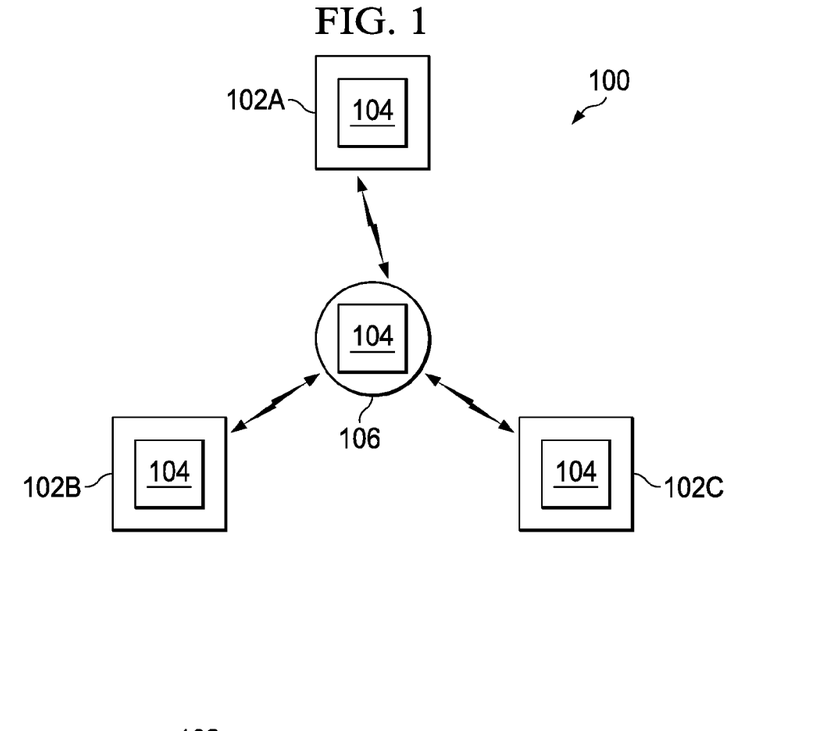
FIG. 1 shows a block diagram of a wireless network including physical layer convergence protocol (PLCP) header processing in accordance with various embodiments.

FIG. 1 shows a block diagram of a wireless network 100 including PLCP header processing in accordance with various embodiments. The network 100 may, for example, be a body area network or a personal area network. The network 100 includes one or more wireless devices 102 A/B/C, 106. The wireless device 106 may operate as a hub, and the wireless devices 102 may operate as stations. In other embodiments, the wireless devices 102, 106 may operate as peers. Each wireless device 102, 106 may include a transceiver 104 that communicatively couples the wireless device 102 to one or more other wireless devices 102, 106. Some embodiments of the transceiver 104 are configured for communication over the relatively short distances applicable to a body area network. For example, the distance between communicating wireless devices 102, 106 may be three meters or less in a body area network. Embodiments of the transceiver 104 may also be configured for ultra-wideband radio frequency (RF) operation.

The transceiver 104 includes a PHY configured for use in the wireless network 100. Embodiments of the PHY are configured to optimize transactions via the network 100 by generating PLCP headers that are aligned with the symbol mapping applied to encode the headers. For example, PLCP headers generated by embodiments of the wireless device 102, 106 may be aligned to the symbol boundaries of group pulse position modulation symbols as specified by the IEEE 802.15.6 standard. By providing such alignment, embodiments of the wireless devices 102, 106 avoid the insertion of pad bits about the PLCP headers and provide optimal transmission efficiency.

Figure 2:
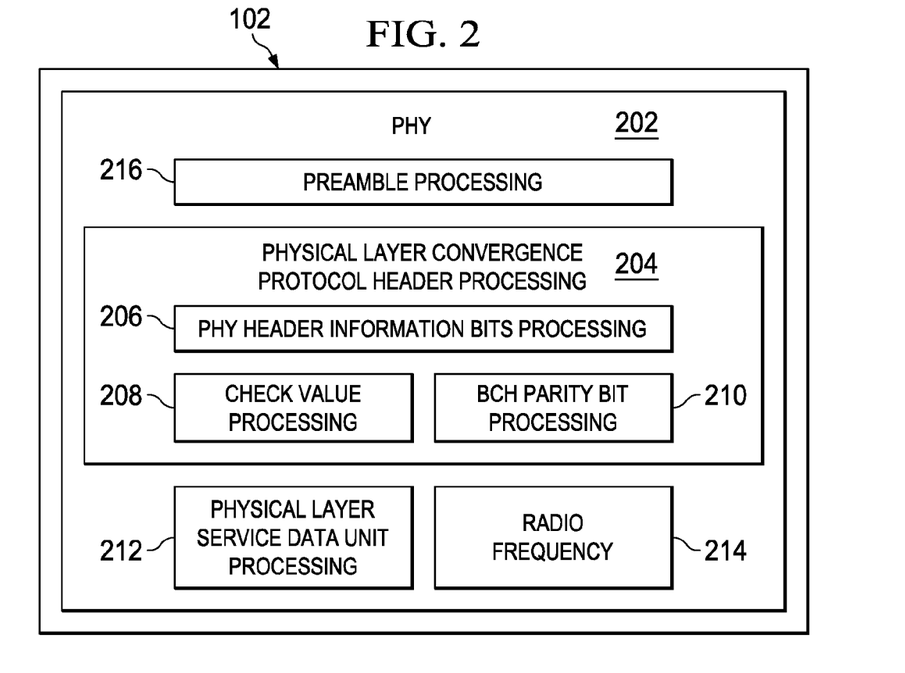
FIG. 2 shows a block diagram of a wireless device including PLCP header processing in accordance with various embodiments.

FIG. 2 shows a block diagram of a wireless device 102 (or 106) including PLCP header processing 204 in accordance with various embodiments. The wireless device 102 includes a PHY 202 that performs physical layer processing. Some embodiments of the PHY 202 are configured to implement impulse radio ultra-wide band transactions. The PHY 202 includes a PLCP preamble processing block 216, PLCP header processing block (i.e., a PLCP header processor) 204, a physical layer service data unit (PSDU) processing block 212 and an RF block 214. The RF block 214 includes circuitry for driving signals onto and/or receiving signals from one or more antennas. The RF block 214 may include amplifiers, filters, upconverters, downconverters, digitizers, analog-to-digital converters, etc.

The PLCP preamble processing block 216 generates a preamble bit-sequence that is transmitted ahead of the PLCP header. In a receiving wireless device, the PLCP preamble processing block 216 may use a received PLCP preamble to facilitate automatic gain control, packet detection, synchronization, carrier-offset recovery, and/or channel estimation. Some embodiments may generate a plurality of different preamble sequences. For example, some embodiments may generate preamble sequences in accordance with the IEEE 802.15.6 standard.

The PSDU processing block 212, for data transmission, assembles PHY data units (physical layer service and/or protocol data units), encodes the data units into symbols, applies modulation to the symbols, and provides the modulated symbols to the RF block 214. For example, the PSDU processing block 212 may encode four information bits of a data unit into an eight bit symbol or encode six information bits of a data unit into a twelve bit symbol, map the symbol bits to pulses, and append a synchronization header to the data unit before the data unit is transferred to the RF block 214 for transmission. For data reception, PSDU processing block 212 may apply complementary operations, that are the reverse of the operations described for transmission, to a data stream received from the RF block 214.

The PLCP header processing block 204 generates PLCP headers for transmission and/or parses PLCP headers received via the wireless medium. The PLCP header processing block 204 includes a PHY header information bits processing block 206, a check value processing block 208, and a BCH (Bose, Chaudhuri, and Hocquenghem) parity bit processing block 210. PHY header information bits processing block 206 generates PHY header information bits for transmission and/or parses PHY header information bits received via the wireless medium.

Some embodiments implements a BCH (63,51) code to generate the parity bits. In such embodiments, a generating polynomial:

$$g(x)=1+x^3+x^4+x^5+x^8+x^{10}+x^{12},$$

is used to encode the information bits. A shortening technique can be applied as follows: For a shortened BCH (k+12, k) that is derived from the BCH (63,51), 51-k zero bits are added to k information bits to produce a 51-bit message. The 51-bit message is encoded using BCH (63, 51), and the 51-k zero bits are removed, leaving the k information bits and 12 parity bits that are transmitted.

The check value processing block 208 generates check values (e.g., cyclic redundancy check (CRC) values) from the header information bits generated by the PLCP header processing block 204. The check values are used to verify header information bits received by the PLCP header processing block 204 via the wireless medium. In some embodiments, the check value processing block 208 generates four CRC bits according to the CRC-4 ITU standard. The check values are appended to the header information bits for transmission.

The BCH parity bit processing block 210 generates forward error correction values for the concatenated header information bits and check values. Embodiments may implement one or more BCH codes. Various embodiments generate twelve parity bits from a BCH code and append the twelve parity bits to the header information bits and check values. The BCH parity bit processing block 210 uses the parity bits to correct errors in the header bits and/or check values of PLCP headers received via the wireless medium. Some embodiments may employ other error correction codes known in the art.

Embodiments of the PLCP header processing block 204 are configured to generate and/or parse PLCP headers that include a number of information bits that is an integer multiple of the number of information bits encoded per symbol by the PSDU processing block 212 or other PLCP header encoding component. Thus, if the PSDU processing block 212 encodes four information bits per symbol into eight information bits, then the PLCP header processing block 204 generates a number of information bits that is an integer multiple of four. Similarly, if the PSDU processing block 212 encodes six information bits per symbol into twelve information bits, then the PLCP header processing block 204 generates a number of information bits that is an integer multiple of six. As used herein, an "information bit" refers a fields defined to carry information or fields reserved for future use, and does not refer to pad bits. By aligning the PLCP header size with the symbol information size, embodiments of the present disclosure avoid transmission of useless overhead and pad bits that degrade network efficiency.

Various components of the wireless device 102, including at least some portions of the PLCP header processing block 204, including the PHY header information bits processing block 206, the check value processing block 208, and the BCH parity bit processing block 210 can be implemented using a processor executing software programming that causes the processor to perform the operations described herein. In some embodiments, a processor executing software programming can generate and/or parse PHY header information bits, generate check values, verify header information based on the check values, generate BCH parity bits, and/or correct PHY header information or check values based on BCH parity bits as described herein.

Suitable processors include, for example, general-purpose microprocessors, digital signal processors, and microcontrollers. Processor architectures generally include execution units (e.g., fixed point, floating point, integer, etc.), storage (e.g., registers, memory, etc.), instruction decoding, peripherals (e.g., interrupt controllers, timers, direct memory access controllers, etc.), input/output systems (e.g., serial ports, parallel ports, etc.) and various other components and sub-systems. Software programming that causes a processor to perform the operations disclosed herein can be stored in a computer readable storage medium. A computer readable storage medium comprises volatile storage such as random access memory, non-volatile storage (e.g., a hard drive, an optical storage device (e.g., CD or DVD), FLASH storage, read-only-memory, or combinations thereof.

Some embodiments can implement portions of the wireless device 102, including portions of the PLCP header processing block 204 using dedicated circuitry (e.g., dedicated circuitry implemented in an integrated circuit). Some embodiments may use a combination of dedicated circuitry and a processor executing suitable software. For example, some portions of the PLCP header processing block 204 may be implemented using a processor or hardware circuitry. Selection of a hardware or processor/software implementation of embodiments is a design choice based on a variety of factors, such as cost, time to implement, and the ability to incorporate changed or additional functionality in the future.

Figure 3A:
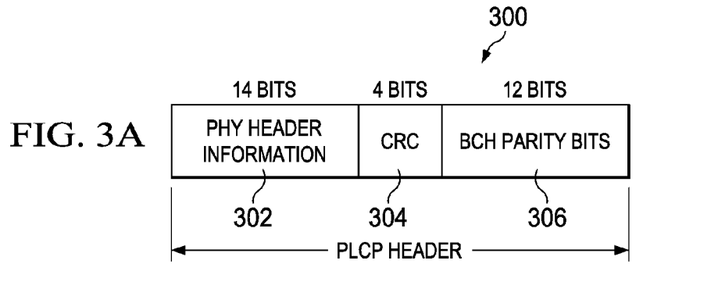
FIGS. 3A and 3B show a first PLCP header and associated physical layer header in accordance with various embodiments.
Figure 3B:
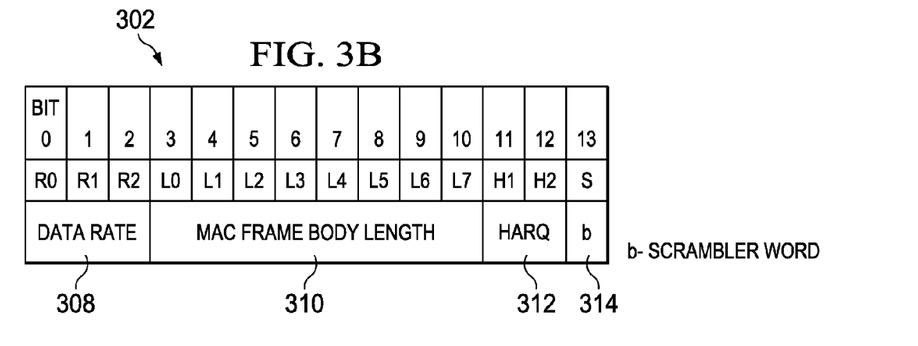

FIGS. 3A and 3B show a first PLCP header 300 and associated physical layer header 302 in accordance with various embodiments. The PLCP header 300 and physical layer header 302 may be generated and/or parsed by the PLCP processing block 204. The PLCP header 300 is configured for use with a PSDU processing block 212 that encodes six information bits per symbol. Consequently, the PLCP header 300 is an integer multiple of six in length (i.e., 30 bits in length). The PLCP header 300 includes a fourteen bit physical layer header 302, four check value bits 304, and twelve BCH parity bits 306. The BCH parity bit processing block 210 may generate the BCH parity bits 306 using a shortened BCH (30, 18) code, where the shortened BCH (30, 18) code is derived from a BCH (63, 51) code.

The physical layer header 302 includes a three-bit data rate field 308, an eight-bit MAC frame body length field 310, a two-bit HARQ field 312, and a single-bit scrambler field 314. Other embodiments of the physical layer header 302 may include one or more fields different in length and/or content from those shown, and/or may position the fields in a different order from that shown. The data rate field 308 contains a value that specifies one of a set of data rates known to communicating devices 102. The data rates and data rate field values may, for example, be those specified by the IEEE 802.15.6 standard. The MAC frame body length field 310 specifies the number of octets (an octet is a group of eight adjacent binary digits) in a MAC frame body of the physical layer service data unit. The HARQ field 312 specifies a hybrid automatic repeat request protocol. The HARQ field values and corresponding protocols may, for example, be those specified by the IEEE 802.15.6 standard. The scrambler field 314 specifies a seed value used to scramble and de-scramble a physical layer data unit. The scrambler field values and corresponding scrambler seeds may, for example, be those specified by the IEEE 802.15.6 standard.

Figure 4A:
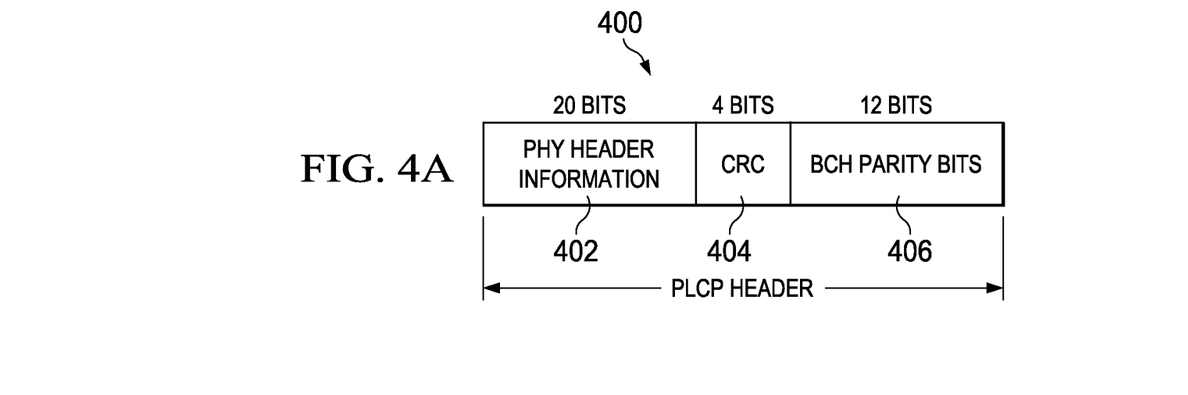
FIGS. 4A and 4B show a second PLCP header and associated physical layer header in accordance with various embodiments.
Figure 4B:
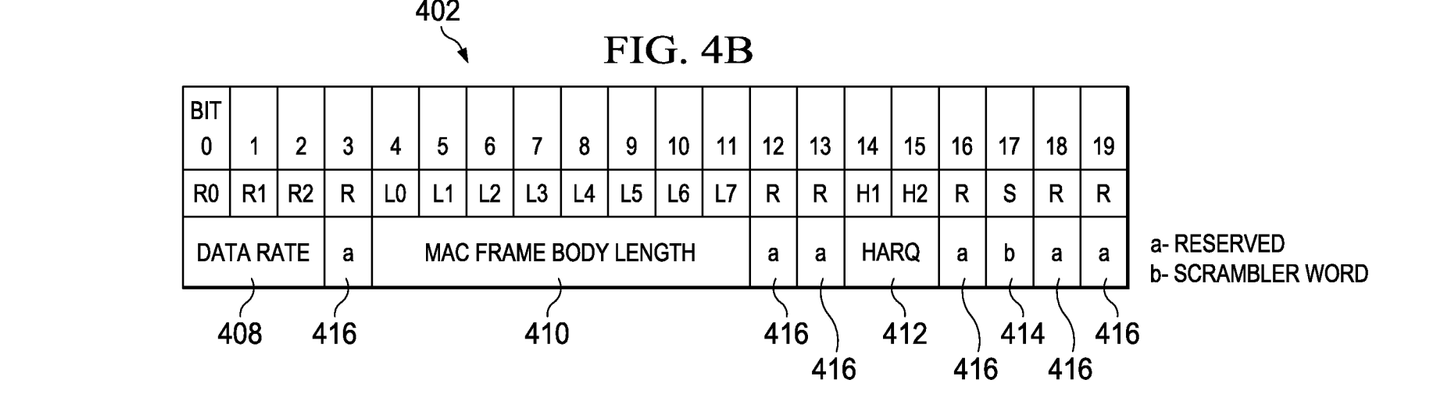

FIGS. 4A and 4B show a second PLCP header 400 and associated physical layer header 402 in accordance with various embodiments. The PLCP header 400 and physical layer header 402 may be generated and/or parsed by the PLCP processing block 204. The PLCP header 400 is configured for use with a PSDU processing block 212 that encodes four or six information bits per symbol. Consequently, the PLCP header 400 is an integer multiple of four and six in length (i.e., 36 bits in length). The PLCP header 400 includes a twenty-bit physical layer header 402, four check value bits 404, and twelve BCH parity bits 406. The BCH parity bit processing block 210 may generate the BCH parity bits 406 using a shortened BCH (36, 24) code, where the shortened BCH (36, 24) code is derived from a BCH (63, 51) code.

The physical layer header 402 includes a three-bit data rate field 408, an eight-bit MAC frame body length field 410, a two-bit HARQ field 412, a single-bit scrambler field 414, and six single-bit reserved fields 416 that are set aside for future use. Other embodiments of the physical layer header 402 may include one or more fields different in length and/or content from those shown, and/or may position the fields in a different order from that shown. The data rate field 408 contains a value that specifies one of a set of data rates known to communicating devices 102. The data rates and data rate field values may, for example, be those specified by the IEEE 802.15.6 standard. The MAC frame body length field 410 specifies the number of octets in a MAC frame body of the physical layer data unit. The HARQ field 412 specifies a hybrid automatic repeat request protocol. The HARQ field values and corresponding protocols may, for example, be those specified by the IEEE 802.15.6 standard. The scrambler field 414 specifies a seed value used to scramble and de-scramble a physical layer data unit. The scrambler field values and corresponding scrambler seeds may, for example, be those specified by the IEEE 802.15.6 standard.

Figure 5A:
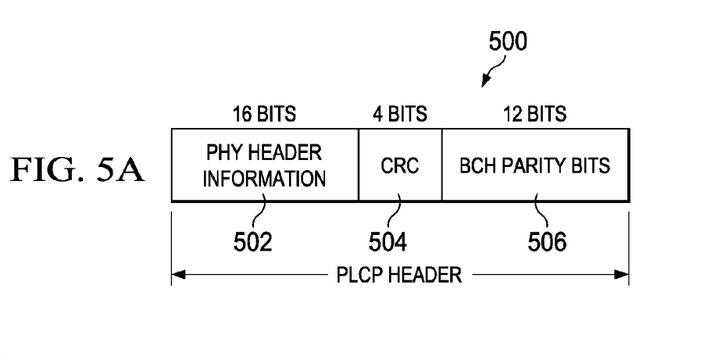
FIGS. 5A and 5B show a third PLCP header and associated physical layer header in accordance with various embodiments.
Figure 5B:
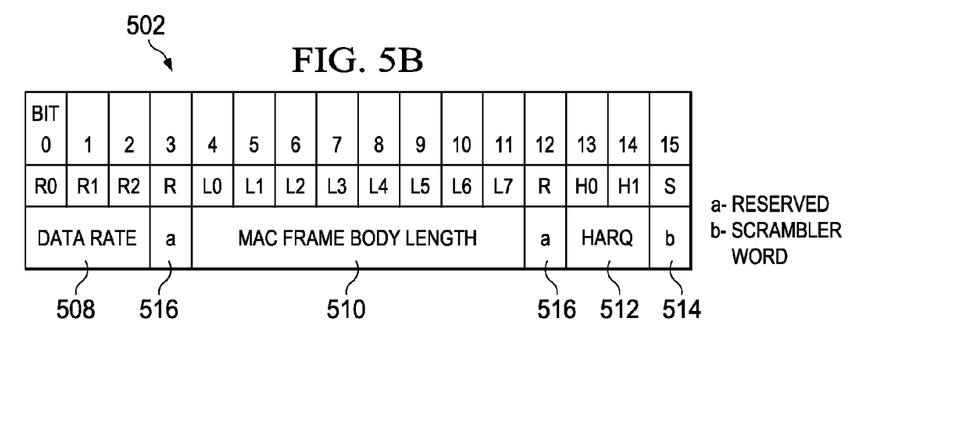

FIGS. 5A and 5B show a third PLCP header 500 and associated physical layer header 502 in accordance with various embodiments. The PLCP header 500 and physical layer header 502 may be generated and/or parsed by the PLCP processing block 204. The PLCP header 500 is configured for use with a PSDU processing block 212 that encodes four information bits per symbol. Consequently, the PLCP header 500 is an integer multiple of four in length (i.e., 32 bits in length). The PLCP header 500 includes a sixteen-bit physical layer header 502, four check value bits 404, and twelve BCH parity bits 406. The BCH parity bit processing block 210 generates the BCH parity bits 406 using a shortened BCH (32, 20) code, where the shortened BCH (32, 20) code is derived from a BCH (63, 51) code.

The physical layer header 502 includes a three-bit data rate field 508, an eight-bit MAC frame body length field 510, a two-bit HARQ field 512, a single-bit scrambler field 514, and two single-bit reserved fields 516 that are set aside for future use. Other embodiments of the physical layer header 502 may include one or more fields different in length and/or content from those shown, and/or position the fields in a different order from that shown. The data rate field 508 contains a value that specifies one of a set of data rates known to communicating devices 102. The data rates and data rate field values may, for example, be those specified by the IEEE 802.15.6 standard. The MAC frame body length field 510 specifies the number of octets in a MAC frame body of the physical layer data unit. The HARQ field 512 specifies a hybrid automatic repeat request protocol. The HARQ field values and corresponding protocols may, for example, be those specified by the IEEE 802.15.6 standard. The scrambler field 514 specifies a seed value used to scramble and de-scramble a physical layer data unit. The scrambler field values and corresponding scrambler seeds may, for example, be those specified by the IEEE 802.15.6 standard.

Figure 6A:
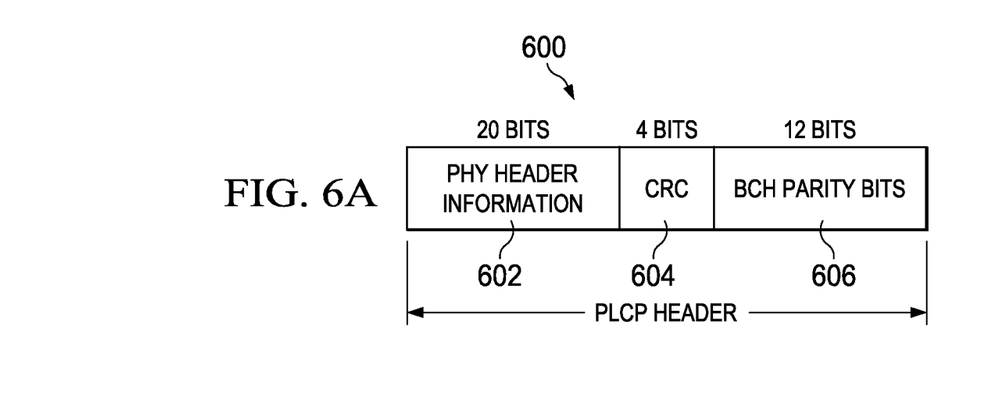
FIGS. 6A and 6B show a fourth PLCP header and associated physical layer header in accordance with various embodiments.
Figure 6B:
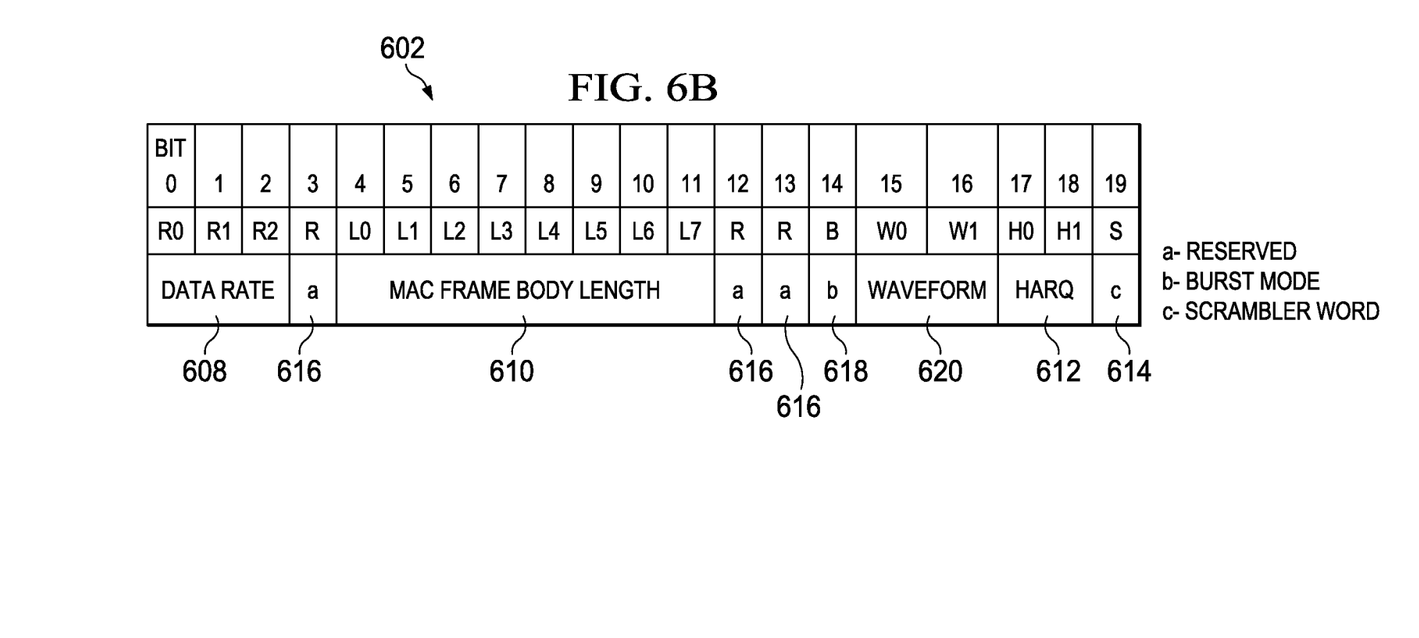

FIGS. 6A and 6B show a fourth PLCP header 600 and associated physical layer header 602 in accordance with various embodiments. The PLCP header 600 and physical layer header 602 may be generated and/or parsed by the PLCP processing block 204. The PLCP header 600 is configured for use with a PSDU processing block 212 that encodes four or six information bits per symbol. Consequently, the PLCP header 600 is an integer multiple of four and six in length (i.e., 36 bits in length). The PLCP header 600 includes a twenty-bit physical layer header 602, four check value bits 404, and twelve BCH parity bits 406. The BCH parity bit processing block 210 generates the BCH parity bits 406 using a shortened BCH (36, 24) code, where the shortened BCH (36, 24) code is derived from a BCH (63, 51) code.

The physical layer header 602 includes a three-bit data rate field 608, an eight-bit MAC frame body length field 610, a two-bit HARQ field 612, a single-bit scrambler field 614, a single-bit burst mode field 618, a two-bit waveform field 620, and three single-bit reserved fields 616 that are set aside for future use. Other embodiments of the physical layer header 602 may include one or more fields different in length and/or content from those shown, and/or position the fields in a different order from that shown. The data rate field 608 contains a value that specifies one of a set of data rates known to communicating devices 102. The data rates and data rate field values may, for example, be those specified by the IEEE 802.15.6 standard. The MAC frame body length field 610 specifies the number of octets in a MAC frame body of the physical layer data unit.

The HARQ field 612 specifies a hybrid automatic repeat request protocol. The HARQ field values and corresponding protocols may, for example, be those specified by the IEEE 802.15.6 standard. The scrambler field 614 specifies a seed value used to scramble and de-scramble a physical layer data unit. The scrambler field values and corresponding scrambler seeds may, for example, be those specified by the IEEE 802.15.6 standard. The burst mode field 618 specifies whether the next packet is part of a burst mode transmission that allows increased throughput by transmitting consecutive frames without acknowledgement. The waveform field 620 specifies the shape of the waveform used to transmit the physical layer data unit. For example, the waveform field 620 may take a value specifying a chirp pulse, a chaotic pulse, etc. Some embodiments employ waveform field values and corresponding waveforms specified by the IEEE 802.15.6 standard.

Figure 7A:
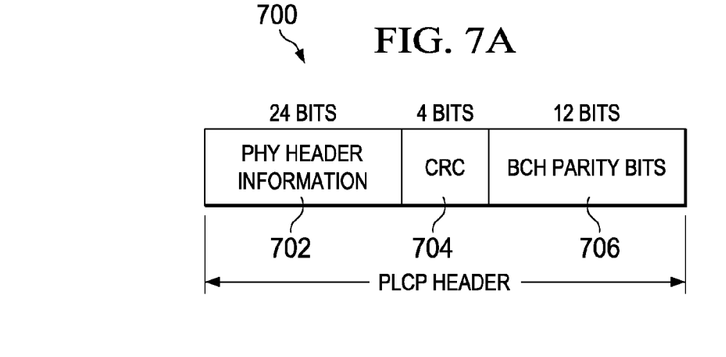
FIGS. 7A and 7B show a fifth PLCP header and associated physical layer header in accordance with various embodiments.
Figure 7B:
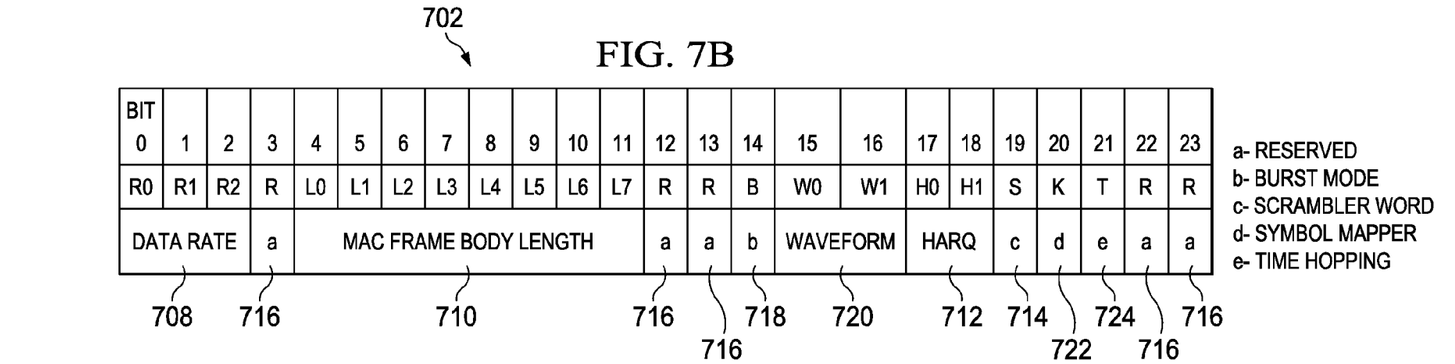

FIGS. 7A and 7B show a fifth PLCP header 700 and associated physical layer header 702 in accordance with various embodiments. The PLCP header 700 and physical layer header 702 may be generated and/or parsed by the PLCP processing block 204. The PLCP header 700 is configured for use with a PSDU processing block 212 that encodes four information bits per symbol. Consequently, the PLCP header 600 is an integer multiple of four in length (i.e., 40 bits in length). The PLCP header 700 includes a twenty-four bit physical layer header 702, four check value bits 704, and twelve BCH parity bits 706. The BCH parity bit processing block 210 generates the BCH parity bits 706 using a shortened BCH (40, 28) code, where the shortened BCH (40, 28) code is derived from a BCH (63, 51) code.

The physical layer header 702 includes a three-bit data rate field 708, an eight-bit MAC frame body length field 710, a two-bit HARQ field 712, a single-bit scrambler field 714, a single-bit burst mode field 718, a two-bit waveform field 720, a single-bit time-hopping field 724, a single-bit symbol mapper field 722, and five single-bit reserved fields 716 that are set aside for future use. Other embodiments of the physical layer header 702 may include one or more fields different in length and/or content from those shown, and/or position the fields in a different order from that shown. The data rate field 708 contains a value that specifies one of set of data rates known to communicating devices 102. The data rates and data rate field values may, for example, be those specified by the IEEE 802.15.6 standard. The MAC frame body length field 710 specifies the number of octets in a MAC frame body of the physical layer data unit.

The HARQ field 712 specifies a hybrid automatic repeat request protocol. The HARQ field values and corresponding protocols may, for example, be those specified by the IEEE 802.15.6 standard. The scrambler field 714 specifies a seed value used to scramble and de-scramble a physical layer data unit. The scrambler field values and corresponding scrambler seeds may, for example, be those specified by the IEEE 802.15.6 standard. The burst mode field 718 specifies whether the next packet is part of a burst mode transmission that allows increased throughput by transmitting consecutive frames without acknowledgement. The waveform field 720 specifies the shape of the waveform used to transmit the physical layer data unit. For example, the waveform field 720 may take a value specifying a chirp pulse, a chaotic pulse, etc. Some embodiments employ waveform field values and corresponding waveforms specified by the IEEE 802.15.6 standard. The time-hopping field 724 specifies whether time-hopping is enabled. The symbol mapper field 722 specifies how information bits are mapped to symbols. Some embodiments employ symbol mapper field values and corresponding symbol mappings specified by the IEEE 802.15.6 standard.

Figure 8:
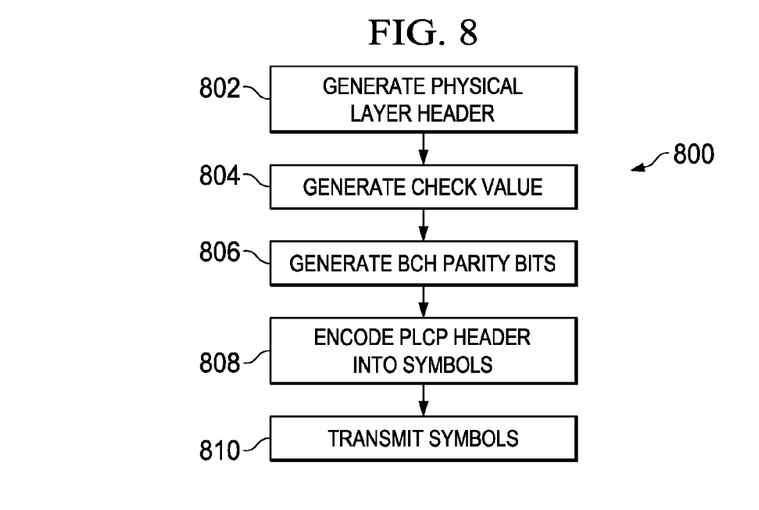
FIG. 8 shows a flow diagram for a method for generating a PLCP header in accordance with various embodiments.

FIG. 8 shows a flow diagram for a method 800 for generating a PLCP header in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 800, as well as other operations described herein, can be implemented by a processor executing instructions stored in a computer readable medium.

In the method 800, the wireless device 102 is operating in the wireless network 100. The PHY 202 of the device 102 is preparing a physical layer data unit for transmission via the wireless network 100. The PLCP header processing block 204 constructs a PLCP header for inclusion in the physical layer data unit.

In block 802, the PHY header information bits processing block generates a physical layer header. The physical layer header consists of a number of bits that allow for construction of a PLCP header that is an integer multiple of the number of information bits encoded in each block symbol by the PSDU processing block 212. The physical layer header may be one of headers 302, 402, 502, 602, 702, or a variation thereof.

In block 804, the check value processing block 208 generates check values based on the physical layer header. In some embodiments, the check values comprise a 4-bit CRC based on the CRC-4 ITU standard, In block 806, the BCH parity bit processing block 210 generates parity bits for forward error correction of the concatenated physical layer header and check values. Embodiments may generate twelve parity bits based on a shortened BCH code derived from a BCH (63, 51) code.

In block 808, the concatenated physical layer header, check values, and parity bits are encoded into symbols by the PSDU processing block 212. The number of information bits encoded per symbol may vary from embodiment to embodiment. For example, some embodiments may encode four information bits per symbol, and other embodiments may encode six information bits per symbol. The aggregate number of information bits on the physical layer header, check values, and parity bits is an integer multiple of the number of information bits encoded per symbol.

In block 810, the symbols are modulated and RF block 214 drives the modulated symbols to one or more antennas for transmission via the wireless medium.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A wireless device, comprising:
a physical layer convergence protocol (PLCP) header processor configured to:
process a physical layer header of 24 bits;
process a check value based on the physical layer header; and
process an error correction code based on the physical layer header and the check value;
wherein a concatenation of the physical layer header, check value, and error correction code that the PLCP header processor is configured to process consists of a number of information bits that is an integer multiple of a number of information bits per symbol used to encode the PLCP header.

2. The wireless device of claim 1, wherein the check value is four bits in length, the error correction code is 12 bits in length, and the number of information bits per symbol is 4.

3. The wireless device of claim 1, wherein the physical layer header comprises:
a data rate field specifying a physical layer data unit data rate;
a media access controller (MAC) frame length field specifying the length of a media access controller frame body;
a HARQ field specifying a hybrid automatic repeat request protocol; and
a burst mode field specifying whether a next packet is part of a burst mode transmission.

4. The wireless device of claim 3, wherein the physical layer header further comprises a pulse type field specifying a transmission pulse shape.

5. The wireless device of claim 1, further comprising an ultra-wideband transceiver configured to access a wireless personal area network.

6. The wireless device of claim 1, wherein the PLCP header processor comprises at least one of a PLCP header generator configured to generate the physical layer header, check value, and error correction code, and a PLCP parser configured to interpret the physical layer header, check value, and error correction code.

7. A method, comprising:
generating, by a wireless device, a physical layer header of 24 bits;
generating, by the wireless device, a check value based on the physical layer header; and
generating an error correction code based on the physical layer header and the check value;
encoding the physical layer header, check value, and error correction code into symbols;
wherein a total number of information bits in the physical layer header, check value, and error correction code is an integer multiple of the number of information bits encoded per symbol.

8. The method of claim 7, further comprising transmitting the symbols on an ultra-wideband body area network.

9. The method of claim 7, wherein generating the physical layer header of 24 bits comprises generating physical layer header fields comprising:
a data rate field specifying a physical layer data unit data rate; and
a burst mode field specifying whether a next packet is part of a burst mode transmission.

10. The method of claim 9, wherein generating the physical layer header comprises generating physical layer header fields further comprising a pulse type field specifying a transmission pulse shape.

11. A system, comprising:
a wireless transmitter configured to transmit information via a wireless network; and
a wireless receiver configured to receive the information via the wireless network;
wherein each of the transmitter and receiver comprises logic configured to process a physical layer convergence protocol (PLCP) header comprising:
a physical layer header of 24 bits;
a check value based on the physical layer header; and
an error correction code based on the physical layer header and the check value;
wherein the aggregate number of information bits of the physical layer header, check value, and error correction code is an integer multiple of a number of information bits per symbol of the PLCP header.

12. The system of claim 11, wherein the physical layer header comprises:
a data rate field specifying a physical layer data unit data rate; and
a burst mode field specifying whether a next packet is part of a burst mode transmission.

13. The system of claim 12, wherein the physical layer header comprises:
a pulse type field specifying a transmission pulse shape.

14. The system of claim 11, wherein the logic comprises at least one of a PLCP header generator and a PLCP header parser in each of the transmitter and receiver; and the wireless network comprises an ultra-wideband wireless personal area network.

15. A physical layer convergence protocol (PLCP) header processing block coupled to a memory for storing a sequence of executable instructions, said PLCP header processing block comprising:
an arrangement of data elements defining a frame of 24 bits comprising:
a data rate field specifying a physical layer data unit data rate;

a media access controller (MAC) frame length field specifying the length of a media access controller frame body;

a HARQ field specifying a hybrid automatic repeat request protocol;

a burst mode field specifying whether a next packet is part of a burst mode transmission;

a pulse type field specifying a transmission pulse shape;

a processor for executing said sequence of executable instructions to perform a plurality of operations comprising:

generating the frame of 24 bits;

generating a check value based on the frame;

generating an error correction code based on the frame and the check value; and encoding the physical layer header, check value, and error correction code into symbols.

\* \* \* \* \*